US012484445B2

(12) United States Patent
Magagnin et al.

(10) Patent No.: US 12,484,445 B2
(45) Date of Patent: Nov. 25, 2025

(54) ELECTRIC POWER GENERATOR CONTAINING AN ACTIVE ORGANIC MATERIAL

(71) Applicants: TERMO-IND SA, Chiasso (CH); POLITECNICO DI MILANO, Milan (IT)

(72) Inventors: Luca Magagnin, Rho (IT); Vincenzo Tirella, Coldrerio (CH)

(73) Assignee: TERMO-IND SA, Chiasso (CH)

( * ) Notice: Subject to any disclaimer, the term of this patent is extended or adjusted under 35 U.S.C. 154(b) by 191 days.

(21) Appl. No.: 18/267,158

(22) PCT Filed: Dec. 18, 2020

(86) PCT No.: PCT/EP2020/087218
§ 371 (c)(1),
(2) Date: Jun. 14, 2023

(87) PCT Pub. No.: WO2022/128129
PCT Pub. Date: Jun. 23, 2022

(65) Prior Publication Data
US 2024/0057481 A1 Feb. 15, 2024

(51) Int. Cl.
*H10N 10/856* (2023.01)
*H10N 10/855* (2023.01)

(52) U.S. Cl.
CPC ........ *H10N 10/856* (2023.02); *H10N 10/855* (2023.02)

(58) Field of Classification Search
CPC ...................................... H01J 45/00
See application file for complete search history.

(56) References Cited

U.S. PATENT DOCUMENTS

| 11,758,814 | B2 | 9/2023 | Matsushita et al. |
| 2020/0144474 | A1 | 5/2020 | Sugiura et al. |
| 2020/0274046 | A1* | 8/2020 | Birmingham .......... H10N 10/81 |
| 2021/0296552 | A1* | 9/2021 | Matsushita .......... H10N 10/856 |

FOREIGN PATENT DOCUMENTS

| WO | WO-2019088002 A1 * | 5/2019 |
| WO | 2020031992 A1 | 2/2020 |

OTHER PUBLICATIONS

WO-2019088002-A1 English machine translation (Year: 2019).*

* cited by examiner

*Primary Examiner* — Andrew J Golden
(74) *Attorney, Agent, or Firm* — Elmore Patent Law Group, P.C.; Joseph C. Zucchero; Carolyn S. Elmore

(57) ABSTRACT

The present invention relates to an electric power generator and a power generator module containing an active organic material.

19 Claims, 10 Drawing Sheets

ELECTRIC POWER GENERATOR CONTAINING AN ACTIVE ORGANIC MATERIAL

FIELD OF THE INVENTION

The present invention relates to an electric power generator containing an active organic material.

STATE OF THE ART

It is widely known the use of thermoelectric power generators and thermionic power generators for the conversion of thermal energy directly into electrical energy.

The thermoelectric power generators are devices based on a thermoelectric effect, namely the Seebeck effect, involving interactions between the flow of heat and of electricity between solid bodies. Examples of such devices are disclosed in the patent EP 2521192 and in the patent application EP 2277209. In broad terms, thermoelectric power generators consist of three main components: thermoelectric material, thermoelectric modules and thermoelectric system that interface with a heat source.

Thermoelectric materials generate power directly from heat by converting temperature differences into electric voltage. In particular, these materials typically have both high electrical conductivity and low thermal conductivity. The low thermal conductivity ensures that when one side is made hot, the other side stays cold. This helps to generate a large voltage while in a temperature gradient.

A thermoelectric module is a circuit containing thermoelectric materials which generate electricity from heat directly. A module consists of two dissimilar thermoelectric materials joining at their ends, namely a negatively charged semiconductor and a positively charged semiconductor. A direct electric current will flow in the circuit when there is a temperature gradient between the two materials. Such gradient is provided by the thermoelectric system which typically comprise heat exchangers used on both sides on the module to supply respectively heating and cooling.

A thermionic power generators, also called thermionic power converters, convert heat directly into electricity. A thermionic power generator typically comprises two electrodes arranged in a containment. One of these is raised to a sufficiently high temperature to become a thermionic electron emitter or "hot plate". The other electrode is called collector because it receives the emitted electrons. The collector is operated at significantly lower temperature. The space between the electrodes can be vacuum or alternatively filled with a vapour gas at low pressure. The thermal energy may be supplied by chemical, solar or nuclear sources.

Thermoelectric power generators as well as thermionic power generators have many drawbacks, among which the low conversion efficiency and the need of providing a temperature gradient. In addition, such generators, requires relatively constant thermal source.

Therefore, it is the primary object of the present invention to provide an electric power generator capable to convert part of the thermal energy in electric energy and allowing to overcome the drawbacks of the devices of the prior art.

In the International application WO 2018/029139, it is already described an active material capable to be applied on one electrode and to generate current when comprised between at least two electrodes, surprisingly without initial charging and dependently on the temperature. Specifically, the material described in WO 2018/029139 comprises at least one oxygen-containing compound selected from the group consisting of MgO, ZnO, ZrOCl$_2$, ZrO$_2$, SiO$_2$, Bi$_2$O$_3$, Al$_2$O$_3$ and TiO$_2$, at least one thickener additive selected from the group consisting of agar agar, xanthan gum, methyl cellulose, and arabic gum, and at least one plasticizer additive, wherein the particle size of the oxygen-containing compound has a specific average diameter. The performances of such an active material were worse in the presence of temperatures above 80° C., and the temperature above 90° C. induced the degradation of the active material with lowering of the device performances and the decrease of stability of the final device.

In the International application WO 2019/122215, a further active material is then proposed, capable to generate electric energy and having also high stability to temperature and thus providing an alternative and improvement compared to the prior art. Said further active material is an essentially dry state active material comprising at least one oxygen-containing compound selected from the group consisting of MgO, ZnO, ZrOCl$_2$, ZrO$_2$, SiO$_2$, Bi$_2$O$_3$, Fe$_3$O$_4$, Al$_2$O$_3$, TiO$_2$, BeO, CaO, Ga$_2$O$_3$, In$_2$O$_3$, GeO$_2$, SnO$_2$ and PbO$_2$, wherein the particle size of the oxygen-containing compound has an average diameter in the range from 10 nm to 40 μm and wherein a thickener additive selected from the group consisting of agar agar, xanthan gum, methyl cellulose, and arabic gum is absent.

The inventors found out that the performances of this essentially dry state active material worsened with the use over time, and that after long usage, a loss of device performances in terms of recovery of the generated electric power due to ageing phenomena occurred.

A further object of the invention is therefore to provide an electric generator capable to stably provide electric energy even in conditions of prolonged use, without loss of performances in terms of recovery of the generated electric power. A still further object of the invention is therefore to provide an electric power generator capable to provide electric energy at constant uniform temperature and/or with gradient of temperature between the two electrodes of the same electric power generator and even in conditions of prolonged use of the device itself.

SUMMARY OF THE INVENTION

The inventors surprisingly found out that a new electric power generator containing an active organic material is capable to provide electric energy at constant uniform temperature and/or with gradient of temperature between at least one electrode and at least one current collector of the same electric power generator without loss of performances in terms of recovery of the generated electric power even in conditions of prolonged use.

Therefore, the present invention relates to an electric power generator (EPG) comprising:
- at least one electrode,
- at least one current collector,
- at least one active organic material interposed between the at least one electrode and the at least one current collector, and
- at least one oxygen-containing compound layer,
- wherein said at least one active organic material comprises at least one organic polymer obtainable by heating in a range of temperature of from 60° C. to 160° C. for a time from 1 hour to 3 hours a mixture comprising from 5 weight % to 70 weight % of polyvinyl alcohol and from 30 weight % to 95 weight % of at least one glycol selected from the group consisting of ethylene glycol and propylene glycol with respect to the total weight of the at least one organic polymer, wherein the at least one oxygen-containing compound layer is in contact to said at least one active organic material and and wherein the at least one oxygen-containing compound layer is in contact of at least one current collector.

The EPG according to the present invention is indeed capable to provide electric energy at constant uniform temperature and/or with gradient of temperature between the at least one electrode and the at least one current collector of the same electric power generator and even in conditions of prolonged use of same and, unexpectedly, the inventors found out that, thanks to said at least one active organic material, the recovery of the generated electric power of the EPG has been even increased, thus providing a further improvement compared to the EPGs of the prior art.

The present invention also relates to a power generator module (PGM) comprising a plurality of EPG which can be connected in series or parallel without compromising the EPG characteristics (voltage and current).

The advantages of the power generator module (PGM) have been outlined above with respect to the EPG according to the invention and are not herewith repeated.

DESCRIPTION OF FIGURES

Further features and advantages of the invention will be more apparent in light of the detailed description of the active material and of the preferred embodiments of the electric power generator with the aid of enclosed drawings in which.

DETAILED DESCRIPTION OF THE INVENTION

Figure 1:
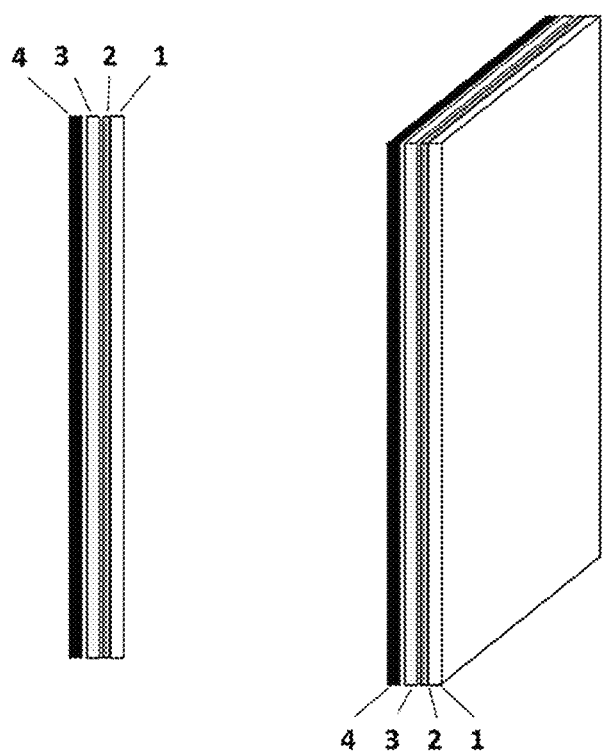
FIG. 1 shows the structure of a configuration of the electric power generator (EPG1) comprising the active organic material according to the present invention.

The present invention relates to an electric power generator (EPG) comprising
at least one electrode,
at least one current collector,
at least one active organic material interposed between the at least one electrode and the at least one current collector, and
at least one oxygen-containing compound layer,
wherein said at least one active organic material comprises at least one organic polymer obtainable by heating in a range of temperature of from 60° C. to 160° C. for a time from 1 hour to 3 hours a mixture comprising from 5 weight % to 70 weight % of polyvinyl alcohol and from 30 weight % to 95 weight % of at least one glycol selected from the group consisting of ethylene glycol and propylene glycol with respect to the total weight of the at least one organic polymer, and
wherein the at least one oxygen-containing compound layer is in contact to said at least one active organic material, and
and wherein the at least one oxygen-containing compound layer is in contact of at least one current collector.

In the present invention when the following terms are used, it is intended:
"in contact" means the formation of an interface with a real contact area among the two materials more that 90% of the geometrical area, with preferred values equal to or higher than 95%;
"at least one current collector" it is intended an essential element of the EPG of the invention which collects and modulates the charges;
"primary current collector" is at least one current collector made of a metal material and/or of an organic/inorganic material which collects and modulates the charges; and
"secondary current collector" is at least one current collector made of a metal material and/or of an organic material which collects and modulates the charges, and electrically interacts with the oxygen-containing compound layer.

Within the framework of the present description and in the subsequent claims, except where otherwise indicated, all the numerical entities expressing amounts, parameters, percentages, and so forth, are to be understood as being preceded in all instances by the term "about". Also, all ranges of numerical entities include all the possible combinations of the maximum and minimum values and include all the possible intermediate ranges, in addition to those specifically indicated herein below.

The EPG according to the present invention is indeed capable to provide electric energy at constant uniform temperature and/or with gradient of temperature between the at least one electrode and the at least one current collector of the same electric power generator and even in conditions of prolonged use of same and, unexpectedly, the inventors found out that, thanks to said at least one active organic material, the recovery of the generated electric power of the EPG has been even increased, thus providing a further improvement compared to the EPGs of the prior art.

The present invention may present in one or more of the above aspects one or more of the characteristics disclosed hereinafter.

The EPG according to the invention comprises at least one active organic material comprising at least one organic polymer obtainable by heating in a range of temperature of from 60° C. to 160° C. for a time from 1 hour to 3 hours a mixture comprising from 5 weight % to 70 weight % of polyvinyl alcohol and from 30 weight % to 95 weight % of at least one glycol selected from the group consisting of ethylene glycol and propylene glycol with respect to the total weight of the at least one active organic polymer.

Preferably, the at least one active organic polymer is obtainable by heating said mixture in a range of temperature of from 120° C. to 150° C., more preferably a 140° C.

In a particularly advantageous embodiment, the invention can provide a second heating step from 120° C. to 150° C., more preferably a 140° C.

Still more preferably the second step can provide the addition of a thickener, preferably glycerol.

Preferably, the at least one active organic polymer is obtainable by heating said mixture for a time of from 1 hour to 2.5 hours, more preferably, the at least one active said organic polymer is obtainable by heating said mixture for a time of about 2 h, still more preferably in air or inert atmosphere.

The mixture according to the invention comprises from 5 weight % to 70 weight % of polyvinyl alcohol and from 30 weight % to 95 weight % of at least one glycol selected from the group consisting of ethylene glycol and propylene glycol with respect to the total weight of the least one active organic polymer. Preferably, said mixture comprises from 8 weight % to 40 weight % of polyvinyl alcohol and from 60 weight % to 92 weight % of at least one glycol selected from the group consisting of ethylene glycol and propylene glycol with respect to the total weight of the least one active organic polymer.

In an advantageous and preferred embodiment, said polyvinyl alcohol has a density in the range from 1.19 to 1.31 g/cm$^3$ at 20° C. The density of the polyvinyl alcohol can be measured with the methods known to the skilled person on this purpose, for example by Pycnometry.

Preferably, said polyvinyl alcohol has a degree of hydrolysis in the range from 86 to 89%. The degree of hydrolysis of the polyvinyl alcohol may be determined according to any one of the methods known to the skilled person on this purpose, for example titration methods.

In a preferred embodiment of the invention, the at least one active organic material comprises at least one thickener additive, preferably selected from the group consisting of agar agar, xanthan gum, methyl cellulose, glycerol and arabic gum.

In a further preferred embodiment of the invention, in the at least one active organic material a thickener additive is absent, more preferably a thickener additive selected from the group consisting of agar agar, xanthan gum, methyl cellulose, glycerol and arabic gum being absent from the at least one active organic material of the EPG according to the invention.

The EPG according to the present invention comprises at least one electrode and at least one current collector.

Said at least one electrode and the at least one current collector may be made of metals, alloys and/or carbon-based materials like graphite. When more the one electrode is present, the further electrode can be made of the same material or different material.

Preferably, the thickness of the at least electrode and, independently, of the at least one current collector is in the range from 0.1 to 3000 µm, more preferably from 50 to 1000 µm, still more preferably from 300 to 600 µm.

In a preferred embodiment of the EPG according to the invention, the at least one electrode and the at least secondary current collector are made of Cu and Al, respectively, preferably in form of plates or foils substantially parallel. In case of flexible EPG both self-standing flexible materials and metallized polymers can be considered as electrodes and as current collectors. The shape of the at least one electrode or of the at least one current collector is however not binding.

The at least one electrode, and independently, the at least one current collector, are preferably made of Cu or Al and can be more preferably subjected to cleaning and etching prior to be used in the electric power generator of the invention.

The EPG according to the invention, comprises at least one at least one oxygen-containing compound layer.

Preferably, said at least one oxygen-containing compound layer can be a passivated layer of said at least one of the at least one current collector, preferably a secondary current collector, or a layer of at least one oxygen-containing compound selected from the group consisting of MgO, ZnO, $ZrOCl_2$, $ZrO_2$, $SiO_2$, $Bi_2O_3$, $Fe_3O_4$, $Al_2O_3$, $TiO_2$, BeO, CaO, $Ga_2O_3$, $In_2O_3$, $GeO_2$, $SnO_2$ and $PbO_2$.

In one embodiment the at least one oxygen-containing compound layer is a passivated layer of the at least one current collector, but it can also be a layer of at least one oxygen-containing compound deposited on the at least one current collector. According to a further embodiment, the at least one oxygen-containing compound layer is both a passivated layer of one side of the at least one current collector and a layer of at least one oxygen-containing compound deposited on the other side of the at least one current collector.

In an advantageous embodiment the at least one oxygen-containing compound layer can be formed in situ after having assembled the EPG when the at least one current collector is a secondary current collector. In this embodiment the secondary collector is aluminum.

Preferably, said at least one oxygen-containing compound has particle average diameter in the range from 5 nm to 40 µm, preferably in the range of 15 nm-10 µm, more preferably 20 nm-5 µm. In another advantageous and preferred aspect of the invention, the particles of oxygen-based compounds have an average diameter in the range from 10-200 nm, more preferably in the range of 15-100 nm, still more preferably 20-40 nm.

The oxygen-containing compound can be anhydrous or can contain a certain amount of the water, as coordinated water molecules, deriving from the process for preparing it: the inventors deem that such coordinated water in the oxygen-containing compound can ameliorate the performances of the final devices obtained therefrom. The oxygen-containing compound can contain coordinated water in the range from 0.5% by weight to 7.5% by weight with respect to oxygen-containing compound preferably from 0.5% to 3.5%, more preferably from 0.5% to 1.5%.

The at least one oxygen-based compound can be placed as powder on said at least one electrode or on the at least one current collector and pressed against it using a machine press, thus obtaining the at least one oxygen-containing compound layer.

Alternative techniques already known in the art can be used, for example sol-gel, inkjet printing and sputtering.

According to the invention the at least one oxygen-containing compound layer is in contact to said at least one active organic material. This means that there is the formation of an interface with a real contact area among the two materials more that 90% of the geometrical area, with preferred values equal to or higher than 95%.

According to the invention the at least one oxygen-containing compound layer is also in contact with the at least one current collector.

According to the invention the at least one oxygen-containing compound layer can be a passivated layer of said at least one current collector. The at least one current collector having a passivated layer can be one available on the market or prepared by passivation of the current collector by thermal or electrolytic oxidation.

The active organic material of the EPG of the invention is preferably deposited in contact with the at least one oxygen-containing compound layer with a thickness from 100 nm to 5 mm. On the other hand, the optimal thickness varies depending on applications, e.g. doctor blade equipment, spraying, etc.

In a preferred embodiment at least one electrode can be a secondary current collector in contact with the at least oxygen-containing compound layer.

In a preferred embodiment the secondary current collector is made of the same material of the at least one electrode. In a further preferred embodiment, the EPG comprises a secondary current collector, preferably made of a material different from the material of the least one electrode.

Preferably, said secondary current collector is made of a material selected from the group consisting of: metals, porous carbon, and conductive oxides, sulphides, alloys with almost constant electric resistivity, manganese oxide and its compounds, phosphates, and mixtures or composites thereof. According to the invention, the alloys with almost constant electric resistivity are for example constantan (55% copper and 45% nickel).

In a preferred embodiment the EPG comprises a further current collector. In a more preferred embodiment, this further collector is a primary collector.

In a still more preferred embodiment, the EPG comprises a primary current collector, more preferably in contact to said secondary current collector. Said secondary current collector is characterized by the oxygen-containing layer on one or on the two sides of the collector.

Preferably, said primary current collector is made of a material selected from the group consisting of: pyrolytic graphite, carbon coke and/or carbon-based materials (e.g. graphene), boron, silicon, germanium, silver and chemically stable semiconductors in their intrinsic and extrinsic state (e.g. gallium arsenide), ceramic materials as carbides and nitrides, perovskites, spinel compounds, PET (polyethylene terephthalate) and mixtures or composites thereof.

Preferably, the electric power generator (EPG) according to the present invention may comprise at least one a porous layer. More preferably said at least one active organic polymer can be adsorbed on the at least one porous layer.

Preferably, said at least one porous layer is made of cellulose, cellulose composite materials, porous carbonaceous materials, and composites with carbon matrix.

More preferably the cellulose material is sodium carboxy methylcellulose.

More preferably the porous carbonaceous material is powder active carbon.

In a preferred embodiment said the at least one porous layer comprises 85% water, 1% sodium carboxy methylcellulose and 14% powder active carbon.

Preferably, the electric power generator (EPG) according to the present invention comprises at least one porous layer in contact to said at least one active organic material.

Preferably, said porous layer has a surface area in the range from 100 to 600 m²/g.

The surface area may be determined according to any one of the methods known to the skilled person on this purpose, for example Capillary Porosimetry or BET adsorption.

In a preferred embodiment schematically shown in FIG. 1, the EPG according to the invention (EPG1) therefore includes:
a current collector (1), specifically a secondary current collector;
an oxygen-containing compound layer (2), as passivated layer in contact with the secondary current collector,
an active organic material (3) and
an electrode (4).

Figure 2:
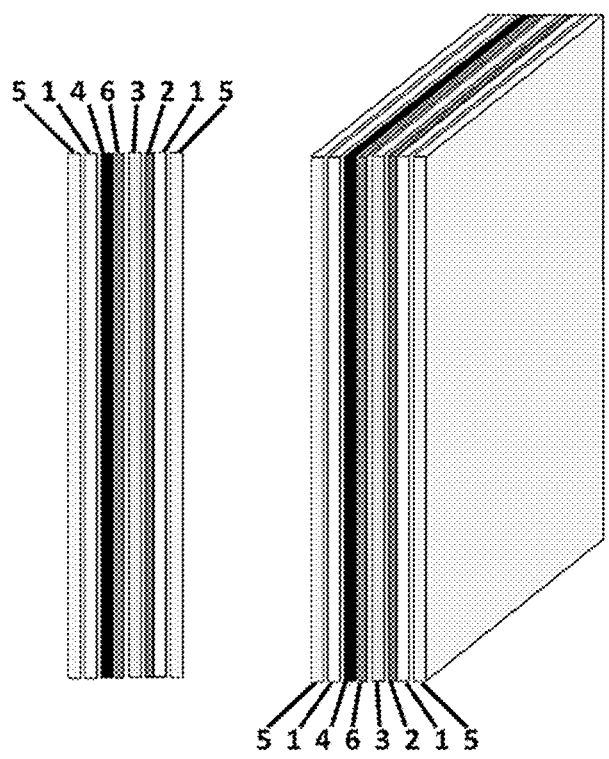
FIG. 2 shows the structure of a further configuration of the electric power generator (EPG2) comprising the active organic material according to the present invention.

In a further preferred embodiment schematically shown in FIG. 2, the EPG according to the invention includes:
a primary current collector (5),
a current collector (1), specifically a secondary current collector;
an oxygen-containing compound layer (2), as passivated layer in contact with the secondary current collector,
an active organic material (3),
a porous layer (6),
an electrode (4),
a secondary current collector (1) and
a primary current collector (5).

The present invention also relates to a power generator module (PGM) comprising a plurality of EPGs which can be connected in series or parallel without compromising the EPG characteristics (voltage and current).

Figure 3:
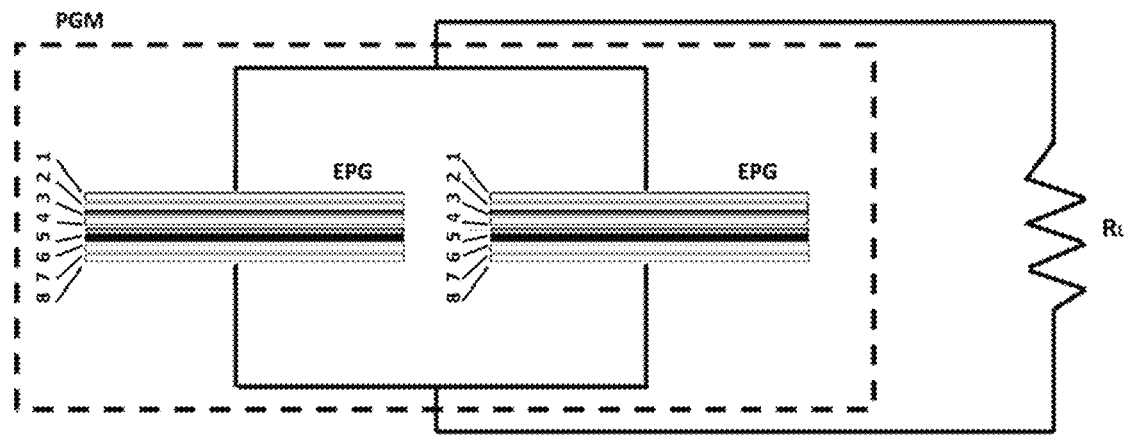
FIGS. 3 and 4 show examples of electrical circuits comprising a PGM having two EPGs according to the present invention, in parallel and in series respectively.
Figure 4:
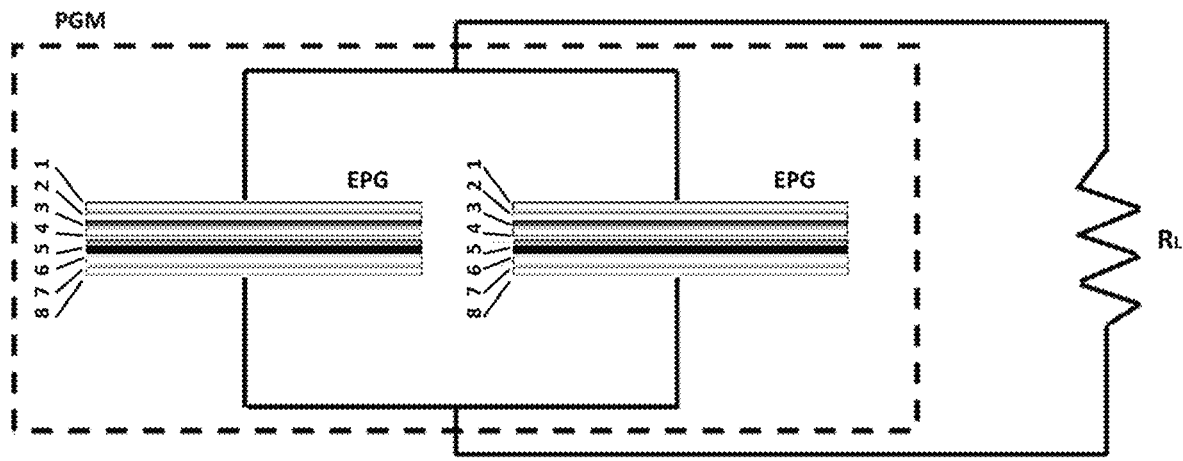

In a further aspect, the invention hence relates to a power generator module (PGM) comprising a plurality of EPG which can be connected in series or parallel. On this regards, FIG. 3 shows a circuit comprising a PGM wherein the two EPGs are connected in parallel, while FIG. 4 shows a circuit comprising a PGM having two EPGs connected in series. Both the circuits of FIGS. 3 and 4 comprise a load resistance $R_L$=100 Ohm. The voltage relative to the PGM can be monitored, for example, by connecting a potentiostat/galvanostat parallel to the load resistance $R_L$. Specifically and advantageously, the current measured by the electric power generator (EPG) of the invention is increased by a factor in the range from 1.5 to 4, increasing the temperature from 20 to 80° C.

The EPG of the invention was characterized by the electric point of view. First, the open circuit voltage (OCV) was measured by means of a multimeter, the EPG device showed a voltage of 0.6 V in the configuration comprising aluminum oxide and graphite as electrodes.

With reference to FIGS. 3 and 4, a dedicated electrical circuit EC was selected, in order to characterize the EPG from the electrical point of view, measuring the voltage across a resistance of 100 Ohm connected to the EPG and the current circulating through the resistance. The invention will now be illustrated by some not limitative examples of the active material and EPG of the invention.

EXAMPLES

Example 1

Preparation of the Active Organic Material 24 grams of polyvinylalcohol (Zeus) and 76 grams of ethylene glycol (Sigma Aldrich) where fed to a glass reactor and then mixed to obtain a mixture. The mixture was heated up while stirring to 140° C. for a time of about 2 h, specifically 1 hour and 55 minutes, thus obtaining a transparent and homogeneous melt of the active organic material. The active organic material was then poured to form a film and cooled down to 25° C.

Example 2

Preparation of the Active Organic Material Adsorbed on a Porous Layer

The active organic material was prepared, according to Example 1. The active organic material obtained was a transparent and homogeneous melt and was poured on a porous layer made of a cellulose and then left to cool down to 25° C.

Example 3

Preparation of the Electric Power Generator 1 of the Invention (EPG1)

The EPG1 device was assembled starting from an electrode (4) of graphite of size 15 mm×35 mm and thickness of 1 mm on top it was deposited via doctor blade equipment the active organic material (3), prepared according to Example 1) with a thickness of 5 mm.

Afterwards, a secondary current collector (1) made of aluminum and having a passivated layer (the at least one oxygen-containing compound layer (2)) was provided. This latter was a secondary current collector with a passivated layer (2) onto the current collector (15 mm×35 mm): specifically, it had one face with the oxygen-containing compound layer like an aluminium foil for commercial capacitor (0.36-0.80 $\mu F/cm^2$)

The final EPG1 device, as represented in FIG. 1 comprised:
- a current collector (1) which is a secondary current collector having an oxygen-containing compound layer (2) (anodic passivated layer);
- an active organic material (3) of Example 1; and
- an electrode (4).

Example 4

Preparation of the EPG2 of the Invention (EPG2)

The EPG2 device was assembled starting from a primary current collector (5) made of pyrolytic graphite with dimensions of 15 mm×50 mm and thickness of 1 mm. On top, it was cladded in contact a secondary current collector (1) in the form of graphite foil with dimensions of 15 mm×35 mm and thickness of 100 µm.

Afterwards, an electrode (4) made of carbon powder with dimensions of 15 mm×35 mm and thickness 100 µm and a porous layer (6) made of 85% water, 1% sodium carboxymethylcellulose, 14% powder active graphite dispersed at the surface with dimensions of 15 mm×35 mm and thickness 1 mm, were deposited on top of the secondary current collector (1).

Subsequently, the active material (3) prepared according to Example 1 was deposited on the porous layer (6) with a thickness of 5 mm.

Then, a secondary current collector (1) made of aluminum and having a passivated layer (the at least one oxygen-containing compound layer (2)) was provided. This latter was a secondary current collector with a passivated layer onto the current collector (15 mm×35 mm): specifically, it had one face with oxygen-containing compound layer like an aluminium foil for commercial capacitor (0.36-0.80 µF/cm²) Finally, a primary current collector (5) made of pyrolytic graphite and having dimensions of 15 mm×50 mm and thickness of 6 mm, was deposited on top of the secondary current collector (1), thus obtaining the final EPG2 device.

The EPG2 as represented in FIG. 2 comprised:
- a primary current collector (5) (15 mm×50 mm): pyrolytic graphite (thickness 6 mm);
- a secondary current collector having an oxygen-containing compound layer (2) (anodic passivated layer);
- an active organic material (3) of Example 1;
- a porous layer (6): 85% water, 1% sodium carboxymethylcellulose, 14% powder active carbon;
- an electrode (4);
- a secondary current collector (1) (15 mm×35 mm): graphite foil (thickness: 100 µm); and
- a primary current collector (5) (15 mm×50 mm): pyrolytic graphite (thickness 1 mm).

Example 5

Characterization of the EPG2 of the Invention (EPG2)

Figure 5:
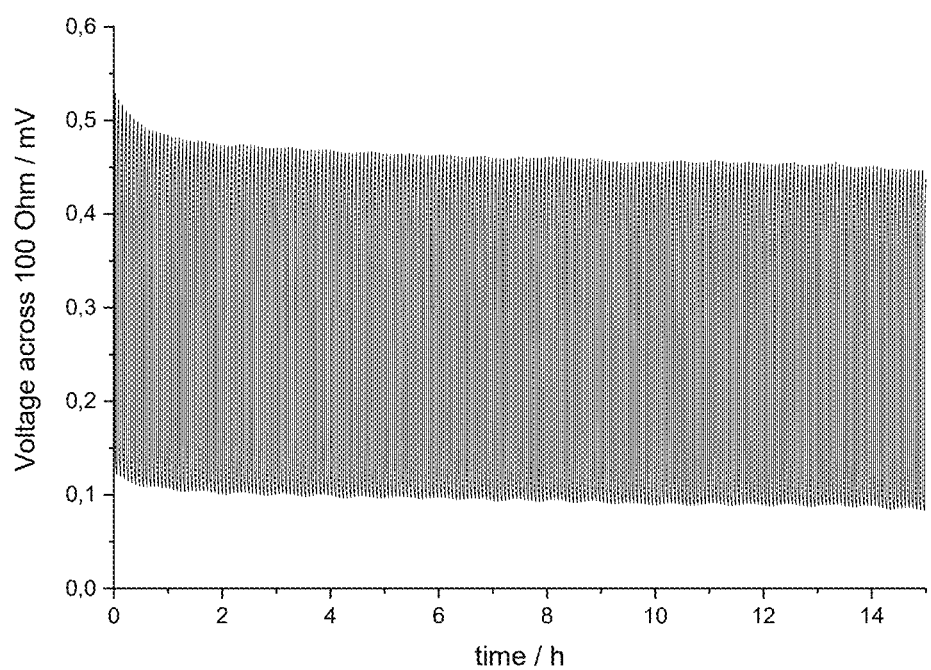
FIG. 5 shows the curve of response of the EPG, assembled according to Example 3 (EPG1) determined during the exposition test according to Example 5.

The EPG2 according to Example 4, was exposed to constant temperature of 25° C. and voltage across the two collectors connected for 2 minutes and disconnected for 2 minutes in parallel at 100 Ohm load, was measured for many cycles. FIG. 5 shows the response of the EPG. When connected the EPG showed a decrease of voltage from 0.5-0.6 V to about 0.1 V and a substantially total recovery of the initial value when disconnected. This behavior consisting in reaching 0.1 V when connected and in recovering initial voltage when disconnected can be exploited for many cycles of connection/disconnection of the EPG to the load. This behavior demonstrates the capability of the EPG of the spontaneous charging recovery during the disconnected phase.

Example 6

Figure 6:
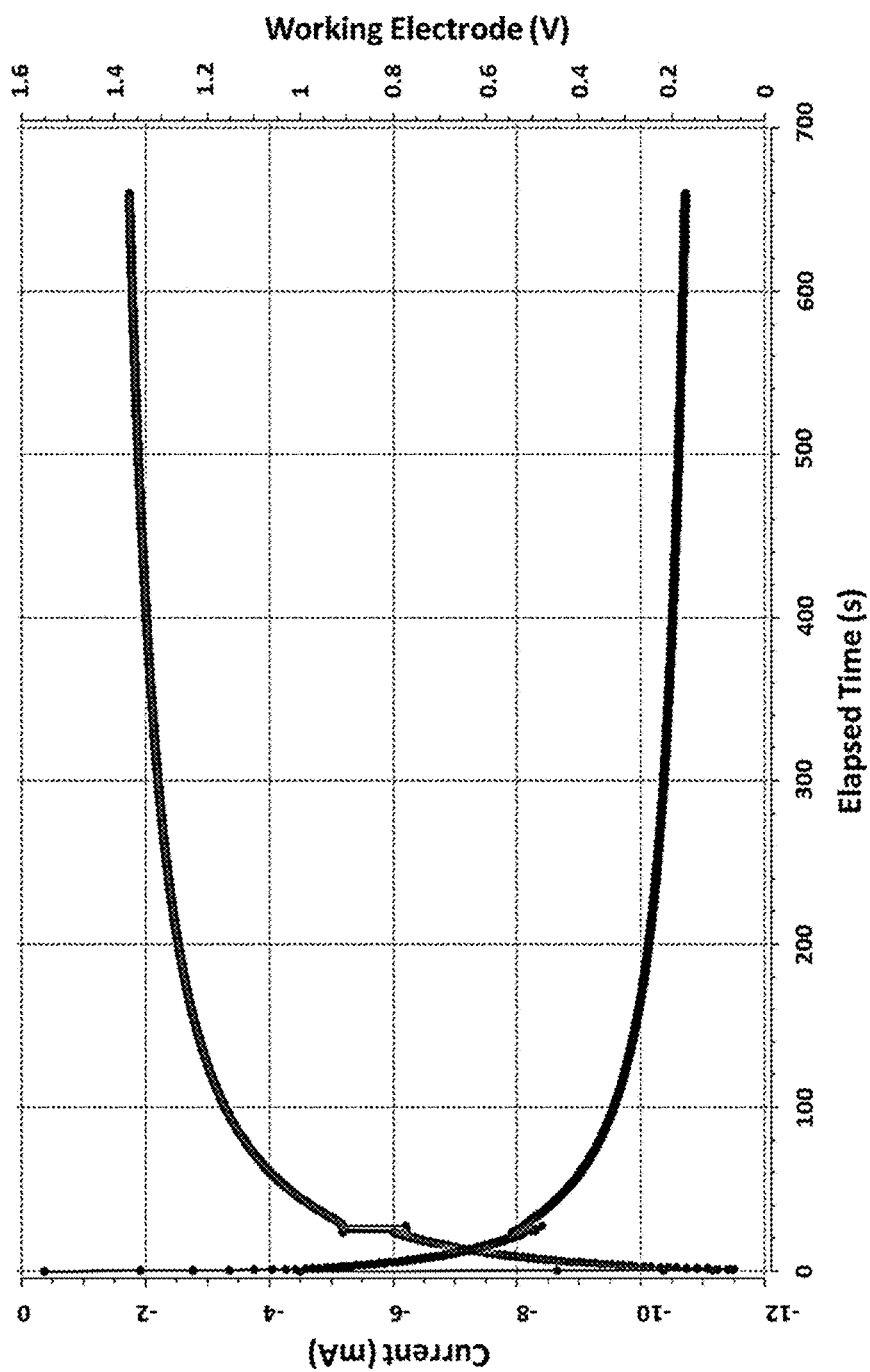
FIG. 6 shows the curve of response of stacks of EPG in series, assembled according to Example 4 (EPG2) determined during the exposition test according to Example 6.

Characterization of a PGM1 of Three Stacks in Series of Five EPGs of the Invention Three stacks, each one of five EPG2, each one assembled according to Example 4, were connected in series, and exposed to constant temperature of 25° C. and the voltage across the two collectors at 100 Ohm load, was measured. FIG. 6 shows the response of the PGM1. When connected the PGM shows a decrease of voltage from 1.6-1.5 V to about 0.2 V and a stable current of about 2 mA. This set up demonstrates the possibility of connection of EPGs in series.

Example 7

Characterization a PGM2 of Five EPGs of the Invention in Parallel

Figure 7:
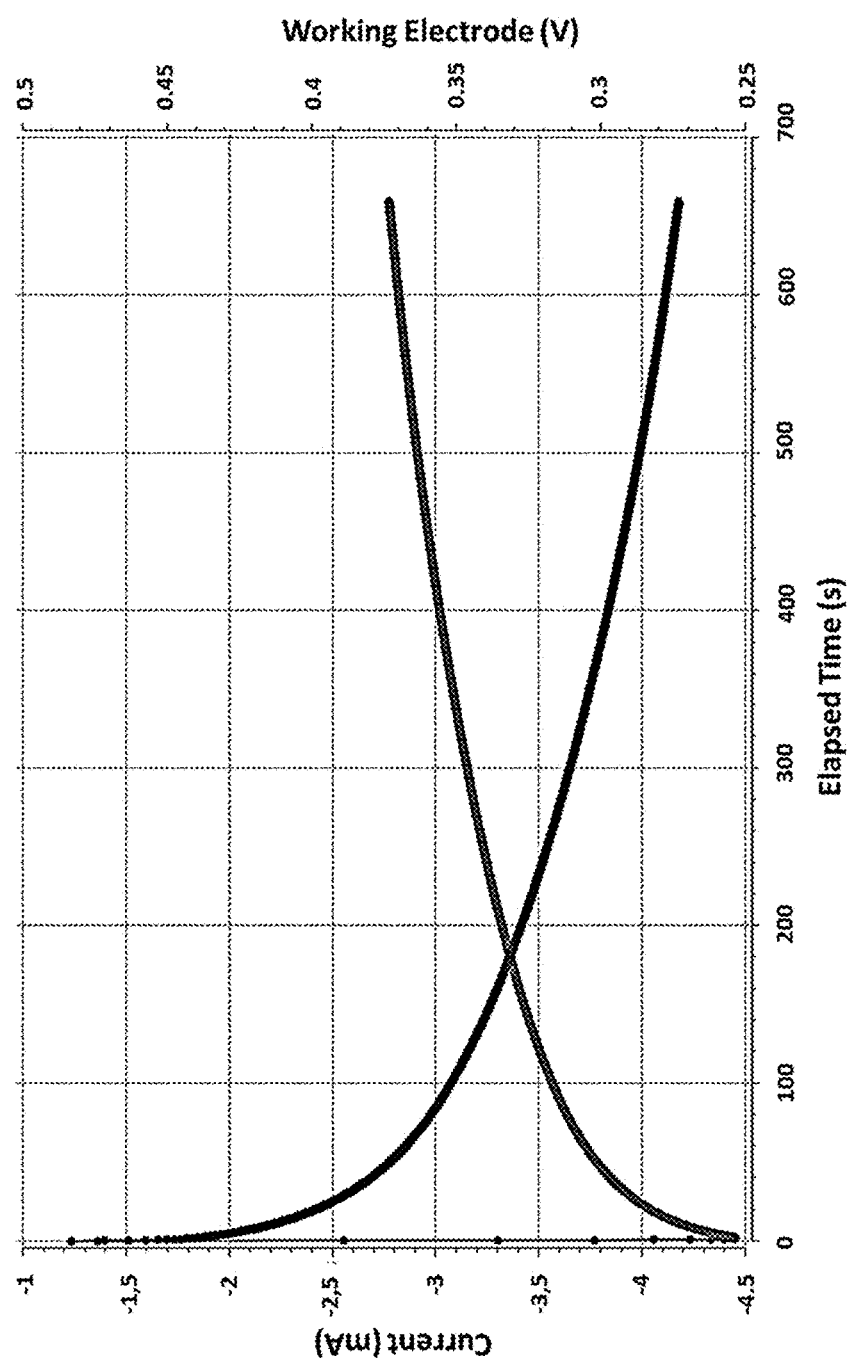
FIG. 7 shows the curve of response of stacks of EPG in parallel, assembled according to Example 4 (EPG2) determined during the exposition test according to Example 7.

Five EPG2, each one assembled according to Example 4, were connected in parallel, and exposed to constant temperature of 25° C. and the voltage across the two collectors connected at 100 Ohm load, was measured. FIG. 7 shows the response of the PGM2. When connected the PGM2 shows a decrease of voltage from 0.5-0.6 V to about 0.25 V and a stable current of about 2.7 mA. This set up demonstrates the possibility of connection of EPGs in parallel.

Example 8

Characterization of the EPG of the Invention (EPG2)

Figure 8:
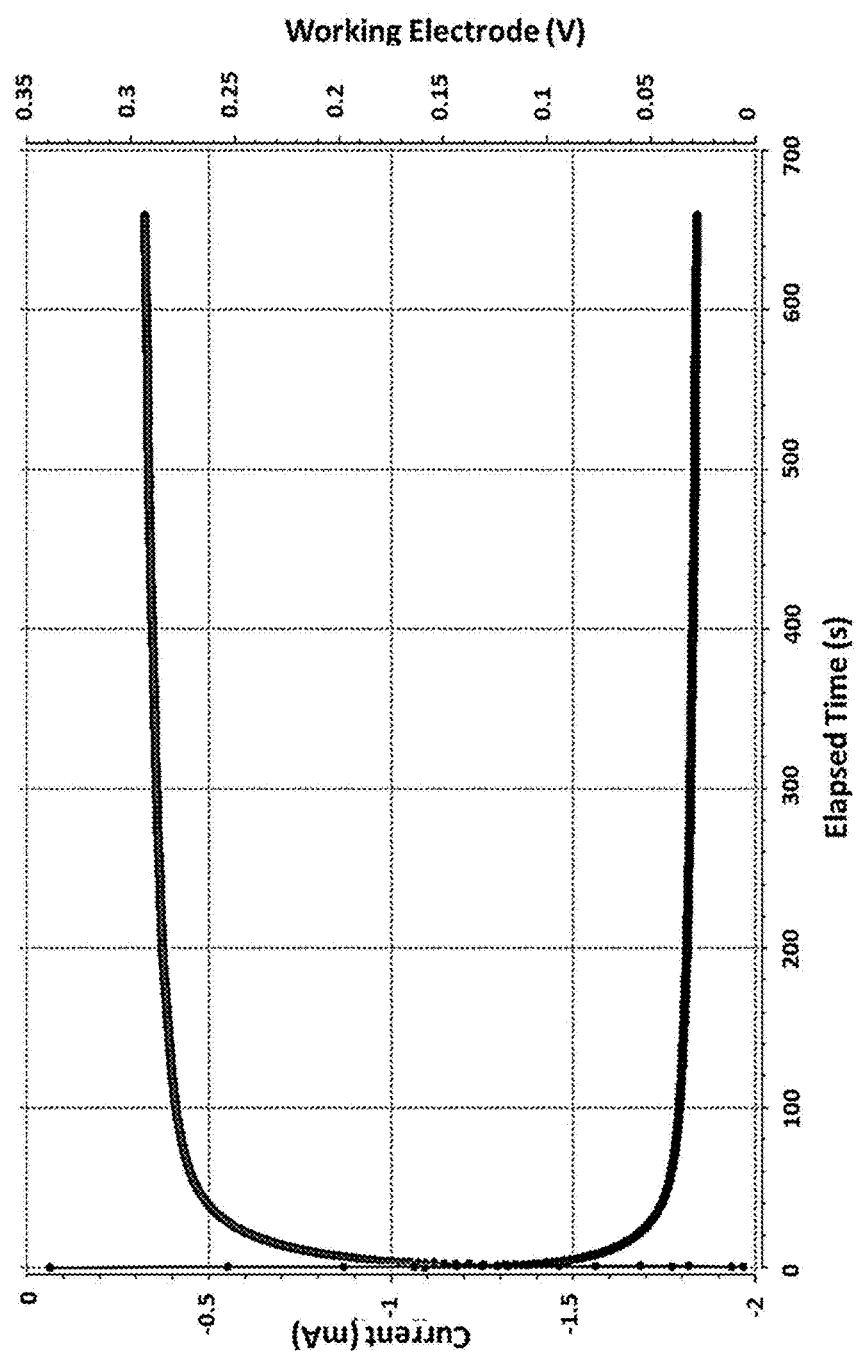
FIG. 8 shows the curve of response of EPG, assembled according to according to Example 4 (EPG2) determined during the exposition test according to Example 8.

The EPG, assembled according to Example 4 was exposed to constant temperature of 25° C. and the voltage across the two collectors connected at 100 Ohm load, was measured. The plot in FIG. 8 shows the response of the EPG. When connected the EPG shows a decrease of voltage from 0.3-0.35 V to about 0.025 and a stable current of about 0.3 mA.

Example 9

Characterization of the Flexible EPG2 of the Invention (EPG2)

The EPG2 device was assembled starting from a primary current collector (5) made of PET polyethylene terephthalate polymeric foil with a silver conductive layer with dimensions of 660 cm$^2$ and thickness of 80 µm. On top, it was deposited a secondary current collector (1) in the form of graphite with dimensions of 660 cm$^2$ and thickness of 10 µm.

Afterwards, an electrode (4) made of carbon powder with dimensions of 660 cm$^2$ and thickness of 24 µm and a porous layer (6) made of 85% water, 1% sodium carboxymethylcellulose, 14% powder active graphite dispersed at the surface with dimensions of 660 cm$^2$ and thickness of 24 µm, were deposited on top of the secondary current collector (1).

Subsequently, the active material (3) prepared according to Example 1 was deposited on the porous layer (6) with a thickness of 48 µm with in between a commercial capacitor paper.

Then, a secondary current collector (1) made of aluminum and having a passivated layer (the at least one oxygen-containing compound layer (2)) was provided. This latter (commercial capacitor aluminum foil) was a secondary current collector with a passivated layer onto the current collector (660 cm$^2$): specifically, it had one face with oxygen-containing compound layer like an aluminium foil for commercial capacitor (0.36-0.80 µF/cm$^2$).

Finally, a primary current collector (5) made of pyrolytic graphite and having dimensions of 15 mm×50 mm and thickness of 6 mm, was deposited on top of the secondary current collector (1), thus obtaining the final EPG2 device.

Figure 9:
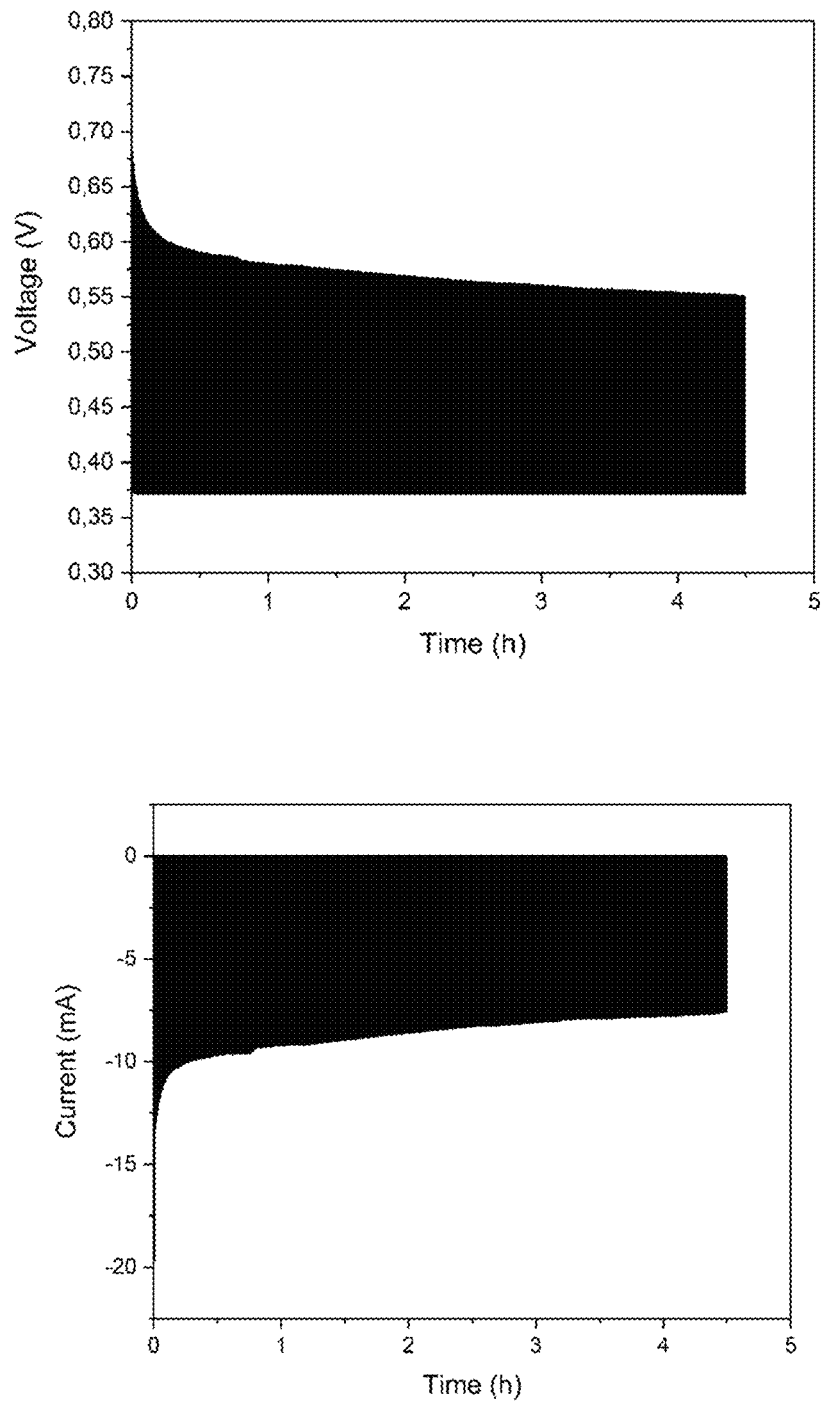
FIG. 9 shows the curve of voltage and current response of EPG, assembled according to Example 2 determined during the exposition test of example 9.

The EPG was exposed to constant temperature of 25° C. and the voltage across the two collectors connected at 100 Ohm load, was measured. The plots in FIG. 9 show the response of the EPG2. When connected the EPG2 showed a decrease of voltage from 0.60-0.65 V to about 0.375 and a stable current of about 7 mA.

Example 10

Characterization of the Flexible EPG2 of the Invention (EPG2) at T=40° C. and 50° C.

Figure 10:
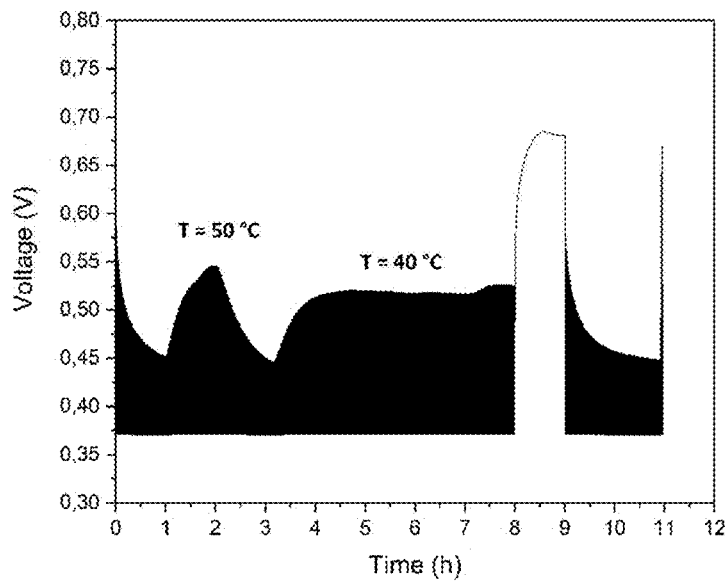
FIG. 10 shows the response of the EPG2 at different temperatures as tested in Example 10.
Figure 10:
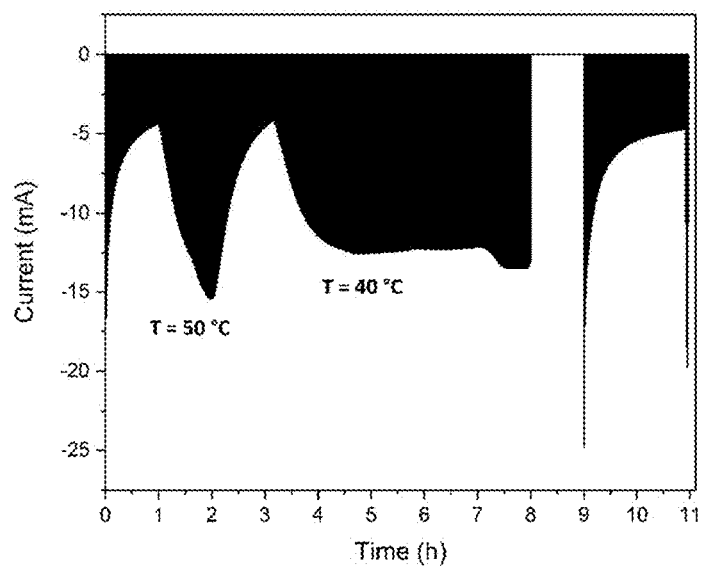

The EPG2 device of the Example 9 was tested at different temperatures with respect to room temperature. The plots in FIG. 10 show the response of the EPG2. When connected the EPG2 showed a decrease of voltage from 0.60-0.65 V to about 0.375 and a current of about 5 mA; when temperature is increased, the values of the voltage and of the current are increased, proportionally to the established temperature.

Example 11

Figure 11:
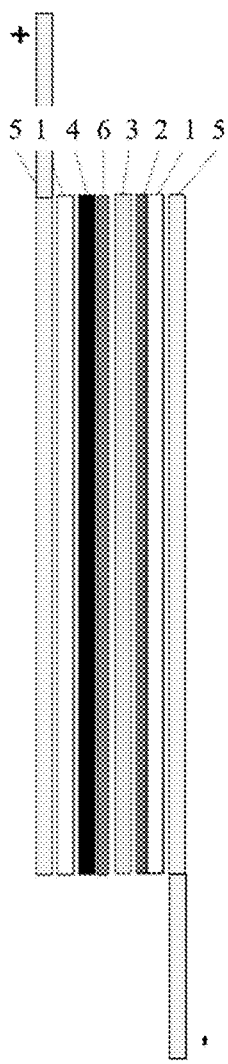
FIG. 11 shows the electric power generator 2 of the invention (EPG2) with the electrical contacts for connection.

Preparation of the Electric Power Generator 2 of the Invention (EPG2) with External Electrical Contacts FIG. 11 shows the electric power generator 2 of the invention (EPG2) with the electrical contacts for connection. Said contacts were outside the active area of the device.

The invention claimed is:

1. An electric power generator (EPG) comprising:
at least one electrode,
at least one current collector,
at least one active organic material interposed between the at least one electrode and the least one current collector, and
at least one oxygen-containing compound layer,
wherein said at least one active organic material comprises at least one organic polymer obtainable by heating in a range of temperature of from 60° C. to 160° C. for a time from 1 hour to 3 hours a mixture comprising from 5 weight % to 70 weight % of polyvinyl alcohol and from 30 weight % to 95 weight % of at least one glycol selected from the group consisting of ethylene glycol and propylene glycol with respect to the total weight of the at least one organic polymer, and
wherein the at least one oxygen-containing compound layer is in contact to said at least one active organic material and
wherein the at least oxygen-containing compound layer is in contact with the at least one current collector.

2. The electric power generator (EPG) according to claim 1, wherein the at least one organic polymer of the at least one active organic material is obtainable by a mixture comprising from 8 weight % to 40 weight % of polyvinyl alcohol and from 60 weight % to 92 weight % of at least one glycol selected from the group consisting of ethylene glycol and propylene glycol with respect to the total weight of the least one active organic polymer.

3. The electric power generator (EPG) according to claim 1, wherein the at least one oxygen-containing compound layer is a passivated layer of said at least one of said at least one current collector.

4. The electric power generator (EPG) according to claim 1, wherein the at least one oxygen-containing compound layer is a layer of at least one oxygen-containing compound selected from the group consisting of MgO, ZnO, ZrOCl$_2$, ZrO$_2$, SiO$_2$, Bi$_2$O$_3$, Fe$_3$O$_4$, Al$_2$O$_3$, TiO$_2$, BeO, CaO, Ga$_2$O$_3$, In$_2$O$_3$, GeO$_2$, SnO$_2$ and PbO$_2$.

5. The electric power generator (EPG) according to claim 1, wherein the at least one oxygen-containing compound layer is formed in situ after having assembled the EPG when the at least one current collector is a secondary current collector.

6. The electric power generator (EPG) according to claim 3, wherein said at least one oxygen-containing compound has a particle average diameter in the range from 5 nm to 40 µm.

7. The electric power generator (EPG) according to claim 1, wherein said EPG comprises a further current collector.

8. The electric power generator (EPG) according to claim 1, wherein the at least one current collector is a secondary collector made of a material selected from the group consisting of: metals, porous carbon, and conductive oxides, sulphides, alloys with almost constant electric resistivity, manganese oxide and its compounds, phosphates and mixtures or composites thereof.

9. The electric power generator (EPG) according to claim 1, wherein the EPG comprises a further current collector, which is a primary current collector.

10. The electric power generator (EPG) according to claim 9, wherein said primary current collector is made of a material selected from the group consisting of: pyrolytic graphite, carbon coke and/or carbon-based materials, boron, silicon, germanium, silver and chemically stable semiconductors in their intrinsic and extrinsic state, ceramic materials as carbides and nitrides, perovskites, spinel compounds and PET (polyethylene terephthalate) and mixtures or composites thereof.

11. The electric power generator (EPG) according to claim 10, wherein said primary current collector is made of PET polyethylene terephthalate polymeric foil with a silver conductive layer.

12. The electric power generator (EPG) according to claim 1, wherein said EPG comprises at least one porous layer.

13. The electric power generator (EPG) according to claim 12, wherein said at least one porous layer is made of cellulose, cellulose composite materials, porous carbonaceous materials, or composites with carbon matrix.

14. The electric power generator (EPG) according to claim 13, wherein the at least one porous layer comprises 85% water, 1% sodium carboxy methyl cellulose and 14% powder active carbon.

15. The electric power generator (EPG) according to claim 12, wherein said at least one organic polymer is adsorbed on said at least one porous layer.

16. The electric power generator (EPG) according to claim 1, wherein said electric power generator (EPG) comprises at least one porous layer in contact to said at least one active organic material.

17. A power generator module (PGM) characterized in that it comprises a plurality of electric power generators (EPGs) according to claim 1, wherein said generators are connected in parallel or in series.

18. The electric power generator (EPG) according to claim 6, wherein the particle average diameter of said at least one oxygen-containing compound is in the range from 15 nm to 10 μm.

19. The electric power generator (EPG) according to claim 18, wherein the particle average diameter of said at least one oxygen-containing compound is in the range from 20 nm to 5 μm.

* * * * *